United States Patent
Thumm et al.

(10) Patent No.: US 11,659,342 B2
(45) Date of Patent: May 23, 2023

(54) HEARING DEVICE

(71) Applicant: SONOVA AG, Staefa (CH)

(72) Inventors: Natasha Thumm, Wetzikon (CH); Markus Müller, Mannedorf (CH)

(73) Assignee: Sonova AG, Staefa (CH)

( * ) Notice: Subject to any disclaimer, the term of this patent is extended or adjusted under 35 U.S.C. 154(b) by 0 days.

(21) Appl. No.: 17/402,165

(22) Filed: Aug. 13, 2021

(65) Prior Publication Data
US 2022/0086576 A1 Mar. 17, 2022

(30) Foreign Application Priority Data

Sep. 17, 2020 (EP) ..................................... 20196592

(51) Int. Cl.
| H04R 25/00 | (2006.01) |
| H01Q 1/12 | (2006.01) |
| H04R 1/10 | (2006.01) |
| H05K 5/00 | (2006.01) |
| H05K 5/02 | (2006.01) |

(52) U.S. Cl.
CPC ............. H04R 25/609 (2019.05); H01Q 1/12 (2013.01); H04R 1/10 (2013.01); H04R 1/1058 (2013.01); H04R 25/65 (2013.01); H05K 5/0004 (2013.01); H05K 5/0217 (2013.01); H05K 5/0247 (2013.01)

(58) Field of Classification Search
CPC .. H04R 25/60; H04R 25/609; H04R 2225/57; H04R 2225/51
See application file for complete search history.

(56) References Cited

U.S. PATENT DOCUMENTS

| 8,366,008 | B2 * | 2/2013 | Kim ..................... H01Q 1/2225 235/492 |
| 9,571,944 | B2 * | 2/2017 | Fischer .................... H01Q 1/38 |
| 9,980,062 | B2 * | 5/2018 | Fischer .................... H01Q 1/38 |
| 10,362,419 | B2 * | 7/2019 | Kuhn ....................... H01Q 7/00 |
| 11,019,435 | B2 * | 5/2021 | Flaig ...................... H04R 25/45 |
| 2007/0297628 | A1 * | 12/2007 | Dittli ...................... H04R 25/65 381/322 |

(Continued)

FOREIGN PATENT DOCUMENTS

| CN | 106993253 A | * | 7/2017 | .......... H04R 25/554 |
| EP | 3554096 | | 10/2019 | |

OTHER PUBLICATIONS

European Search Report dated Feb. 5, 2021 in corresponding European Application No. 20196592.8.

*Primary Examiner* — Ryan Robinson
(74) *Attorney, Agent, or Firm* — ALG Intellectual Property, LLC

(57) ABSTRACT

The present disclosure relates to a hearing device, comprising at least one electronic component and at least two parts of a housing, at least one of them configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component.

11 Claims, 6 Drawing Sheets

(56) References Cited

U.S. PATENT DOCUMENTS

| | | | |
|---|---|---|---|
| 2008/0272980 A1* | 11/2008 | Adel | H01Q 9/27 |
| | | | 343/895 |
| 2010/0158291 A1* | 6/2010 | Polinske | H04R 25/602 |
| | | | 29/896.21 |
| 2017/0055088 A1 | 2/2017 | Rabel | |
| 2017/0064467 A1 | 3/2017 | Fischer | |

* cited by examiner

HEARING DEVICE

RELATED APPLICATIONS

The present application claims priority to EP Patent Application No. EP 20196592.8, filed Sep. 17, 2020, the contents of which are hereby incorporated by reference in their entirety.

BACKGROUND INFORMATION

In conventional hearing device designs the antenna may be placed onto a printed circuit board which is connected to an electronic component with two solder points. In order to assemble the hearing device the electronical component may be mounted in a frame. Afterwards a top housing may be clicked onto the frame and secured with a pin. Then a bottom housing may be clicked onto the assembly and secured with a second pin.

US 2017/0055088 A1 describes a hearing aid which incorporates an antenna integrated into the housing or shell. The hearing aid shell may be constructed by forming an inner shell portion, disposing an antenna on an outer surface of the inner shell portion, and forming an outer shell portion around the inner shell portion. In various embodiments, the hearing aid shell may be constructed using an injection molding process or a 3D printing process.

BRIEF DESCRIPTION OF THE DRAWINGS

The present disclosure will become more fully understood from the detailed description given hereinbelow and the accompanying drawings which are given by way of illustration only, and thus, are not limitive of the present disclosure, and wherein.

Corresponding parts are marked with the same reference symbols in all figures.

DETAILED DESCRIPTION

Figure 1:
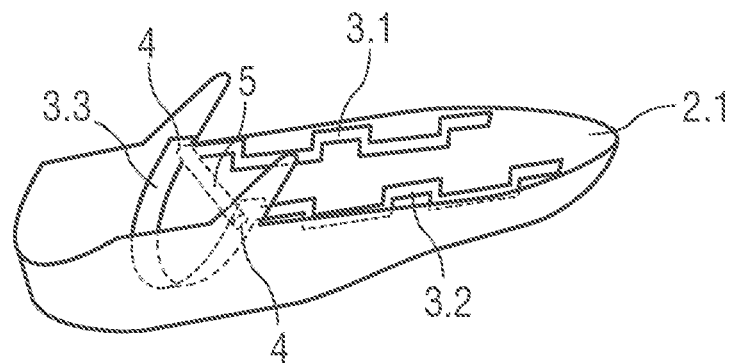
FIG. 1 is a schematic view of a first exemplary embodiment of a part of a housing of a hearing device configured as a molded interconnect device comprising an antenna.

It is a feature of the present disclosure to provide an improved hearing device.

For the purposes of the present application a hearing device means any device configured to process audio signals at, in or around the ear, including but not limited to implantable, partially implantable or non-implantable medical hearing devices like hearing aids or Over-The-Counter (OTC) hearing aids, hearing protection devices, headsets, intercom devices, earbuds, earphones, headphones, hearables, personal sound amplifiers, earpieces, earmolds, otoplastics, as well as any ear-level device for processing of physiological or health information of the user.

According to the present disclosure, a hearing device comprises at least one electronic component and at least two parts of a housing, at least one of them configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component. The electronic component may be an electronic assembly or an electronic core of the hearing device comprising one or more integrated circuits which may include one or more of a processor, a memory and a wireless adapter.

In an exemplary embodiment, the electronic component is fixed on the other one of the parts of the housing or on the frame or on a printed circuit board and/or electrically contacted to the assembly pin through the other one of the parts of the housing or through the frame or through the printed circuit board.

In an exemplary embodiment, the at least one electrically conductive trace comprises an antenna or an antenna is formed by the at least one electrically conductive trace.

In an exemplary embodiment, the at least one electrically conductive trace is arranged on the molded interconnect device by aerosol jet printing.

In an exemplary embodiment, the hearing device comprises a further molded interconnect device comprising at least one electrically conductive trace and at least one pin seat and being mechanically and electrically connected to the molded interconnect device and the at least one electrically conductive trace thereof by at least one further assembly pin held in the at least one pin seat.

In an exemplary embodiment, the at least one assembly pin is a metal pin or a pin with a metallic coating or a pin with two metal or metallic coating ends and an electrically insulating section between the two metal or metallic coating ends.

In an exemplary embodiment, the antenna is a dipole antenna having two arms configured as two electrically conductive traces, both of them electrically connected to the electronic component by one assembly pin.

In an exemplary embodiment, the antenna is a dipole antenna or a loop antenna having two terminals, wherein each terminal is separately electrically connected to the electronic component by one respective metal or metallic coating assembly pin or by one respective metal or metallic coating end of one assembly pin with two metal or metallic coating ends and an electrically insulating section between the two metal or metallic coating ends.

In an exemplary embodiment, the hearing device comprises two housing parts, wherein the antenna is formed by at least one electrically conductive trace in each housing part, wherein the housing parts are connected to each other by the at least one assembly pin, at least one of them electrically connecting the conductive traces to the electronic component.

In an exemplary embodiment, at least one metal or metallic coating spring bushing is arranged in at least one of the pin seats to electrically interconnect the at least one assembly pin to the at least one electrically conductive trace.

In an exemplary embodiment, the metal or metallic coating assembly pin and/or the bushing comprises at least one of titanium, aluminum, steel and gold.

In an exemplary embodiment, the at least one assembly pin is configured as a conical assembly pin, a preloaded sprung assembly pin and/or a bent or cranked sprung assembly pin.

In an exemplary embodiment, the hearing device is configured as a behind-the-ear part of a hearing device.

In an exemplary embodiment, the frame comprises a battery compartment, wherein the assembly pin is configured as a hinge or part thereof to allow for opening and closing the battery compartment. This option may also be employed in an in-the-ear device.

According to an aspect of the present disclosure, a method for electrically connecting a molded interconnect device to an electronic component in a hearing device is provided, the molded interconnect device being a part of a housing and comprising at least one electrically conductive trace and at least one pin seat, the method comprising mechanically connecting the molded interconnect device to another part of the housing or to a frame by at least one assembly pin held in the at least one pin seat, thereby also directly or indirectly electrically connecting the at least one electrically conductive trace to the at least one electronic component by the at least one assembly pin.

The present disclosure relates to a connection technique which is used to create a detachable connection between a plastic part with an integrated electronic circuit, e.g. an antenna, and an electronic component inside the hearing aid or a printed circuit board or a second plastic part with an integrated electronic circuit.

According to the present disclosure, a molded interconnect device is used as a main plastic part of a hearing device, e.g. a frame or housing part, in particular a bottom housing or top housing. In an exemplary embodiment, the molded interconnect device is a top housing comprising an antenna at an interior side. This provides for a large active antenna area and a large distance to potentially interfering electronic components resulting in an enhanced antenna performance compared to conventional PCB designs.

A molded interconnect device (MID) is an injection-molded thermoplastic part with integrated electronic circuit traces. This technology combines a plastic substrate/housing with circuitry into a single part by selective metallization. In MIDs mechanical functions are integrated with electrical assemblies, e.g. a HF-antenna, heating, shielding, switches, contacts. MIDs can be manufactured as precise parts and allow for shorter process chains which reduces the probability of errors. With regard to recycling MIDs comprise materials which are less critical as waste compared to printed circuit boards. With sufficiently high unit numbers, assembly costs of devices with MIDs can be reduced.

Aerosol jet printing (AJP) is a printing technology which enables to print an electronic circuit onto a 3D-injection molded plastic part.

In an exemplary embodiment, the antenna arranged in the housing part is electrically connected to the electronic component or printed circuit board, e.g. in the frame, by using a metal assembly pin which is typically used to mechanically lock the housing parts. Additionally, a second pin could also be used to connect an integrated antenna on a top housing with an integrated antenna in a bottom housing.

The two feeding points of the antenna can be connected to each other by using a regular electrical conductive assembly pin. If two feeding points have to be connected independently two assembly pins at different positions can be used or one assembly pin with an insulating segment between the two ends can be used if the feeding points on the housing are on the opposite side, depending on the type of antenna used.

Application of a molded interconnect device comprising an antenna in a hearing device allows for reducing mass, volume and part count, so that a smaller hearing device can be obtained. Moreover, a molded interconnect device allows for high design flexibility and reduced complexity in hearing aid architecture. The distance to potentially influencing parts can be reduced which may result in improved reliability compared to a PCB antenna. The active antenna area can be increased thereby also increasing the antenna performance.

As opposed to solutions in which the antenna is soldered to the electronic component, serviceability of the device according to the present disclosure is improved.

Due to the improved position of the antenna integrated in top housing as far away as possible to potentially influencing parts, the reliability and performance of the antenna is improved. With the proposed pin connection, a fitter can easily exchange the housing only using the pins. Hearing aids should be as small as possible and conventional detachable connections require too much space (e.g. the smallest SMD connection has a size of: 1 mm×2 mm×1 mm). With the solution according to the present disclosure, no additional component is needed as a connector. The size can additional be reduced as a PCB antenna is not required. Regarding the reliability of the connection in hearing devices, cerumen and sweat may enter the hearing device and conventional detachable connections such as SMD contacts might be exposed to fluids and cause connection problems. The solution according to the present disclosure provides a more reliable design since the electrical connection may be inside the pin holes so fluids have a longer way to enter.

Further scope of applicability of the present disclosure will become apparent from the detailed description given hereinafter. However, it should be understood that the detailed description and specific examples, while indicating exemplary embodiments of the present disclosure, are given by way of illustration only, since various changes and modifications within the spirit and scope of the present disclosure will become apparent to those skilled in the art from this detailed description.

FIG. 1 is a schematic view of a first exemplary embodiment of a part 2.1 of a housing 2 of a hearing device 1. The hearing device 1 may be a behind-the-ear hearing device and the housing part 2.1 may be a top housing part, i.e. a part pointing upward when the hearing device 1 is worn behind the ear of a user. The hearing device 1 may comprise at least one electronic component and at least two parts 2.1 of a housing 2, at least one of them configured as a molded interconnect device comprising at least one electrically conductive trace 3.1, 3.2, 3.3 and at least one pin seat 4, e.g. two pin seats 4. The molded interconnect device may be mechanically connected to another one of the parts of the housing 2 or to a frame by at least one assembly pin 5 held in the at least one pin seat 4, wherein the at least one assembly pin 5 also directly or indirectly electrically connects the at least one electrically conductive trace 3.1, 3.2 or some of the electrically conductive traces 3.1, 3.2 to the at least one electronic component which may be fixed on the other one of the parts of the housing 2 or on the frame.

In an exemplary embodiment, the antenna is configured as a dipole antenna having two arms formed by two of the electrically conductive traces 3.1, 3.2, both of them electrically connected to the electronic component by one assembly pin 5. For this purpose, the electrically conductive traces 3.1, 3.2 may extend into the respective pin seats 4.

In an exemplary embodiment, another electrically conductive trace 3.3 is provided in the molded interconnect device as a connection loop, electrically connecting the two arms of the antenna, i.e. the electrically conductive traces 3.1, 3.2. A conductible assembly pin 5, e.g. a metal or metallic coating assembly pin 5, may be used to create a dipole antenna with a connection loop. With this connection loop the two arms of the dipole antenna can communicate with each other. The assembly pin 5 can be used to contact the antenna to the electronic component, e.g. a printed circuit board or the frame which may be configured as another molded interconnect device.

Figure 2:
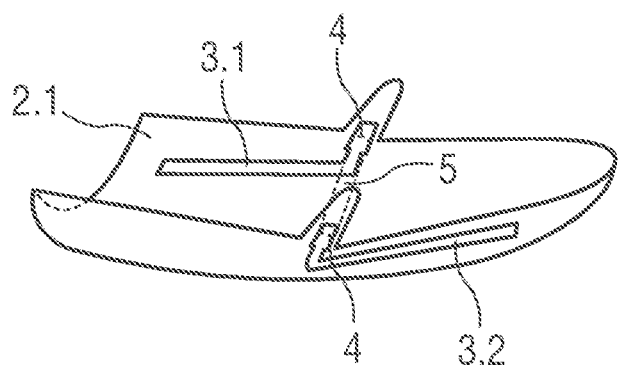
FIG. 2 is a schematic view of a second exemplary embodiment of a part of a housing of a hearing device configured as a molded interconnect device comprising an antenna.

FIG. 2 is a schematic view of a second exemplary embodiment of a part 2.1 of a housing 2 of a hearing device 1. The hearing device 1 may be a behind-the-ear hearing device and the housing part 2.1 may be a top housing part, i.e. a part pointing upward when the hearing device 1 is worn behind the ear of a user. The hearing device 1 may comprise at least one electronic component and at least two parts 2.1 of a housing 2, at least one of them configured as a molded interconnect device comprising at least one electrically conductive trace 3.1, 3.2 and at least one pin seat 4, e.g. two pin seats 4. The molded interconnect device may be mechanically connected to another one of the parts of the housing 2 or to a frame by at least one assembly pin 5 held in the at least one pin seat 4, wherein the at least one assembly pin 5 also directly or indirectly electrically connects the at least one electrically conductive trace 3.1, 3.2 to the at least one electronic component which may be fixed on the other one of the parts of the housing or on the frame. For this purpose, the electrically conductive traces 3.1, 3.2 may extend into the respective pin seats 4.

The antenna is configured as a dipole antenna having two arms formed by two electrically conductive traces 3.1, 3.2, both of them electrically connected to the electronic component by one assembly pin 5. Other than in the embodiment of FIG. 1 there is no other electrically conductive trace connecting the two arms of the antenna. One assembly pin 5 with two metal or metallic coating ends and an electrically insulating section between the two metal or metallic coating ends may be used to contact the antenna to the electronic component, e.g. a printed circuit board or the frame which may be configured as another molded interconnect device. In the alternative, two conductible assembly pins 5 may be used, each one separately contacting one respective electrically conductive trace 3.1, 3.2 to the electronic component, e.g. a printed circuit board or the frame which may be configured as another molded interconnect device. If two assembly pins 5 are used, their respective pin seats 4 may be offset so that the two assembly pins 5 are not coaxially arranged.

Figure 3:
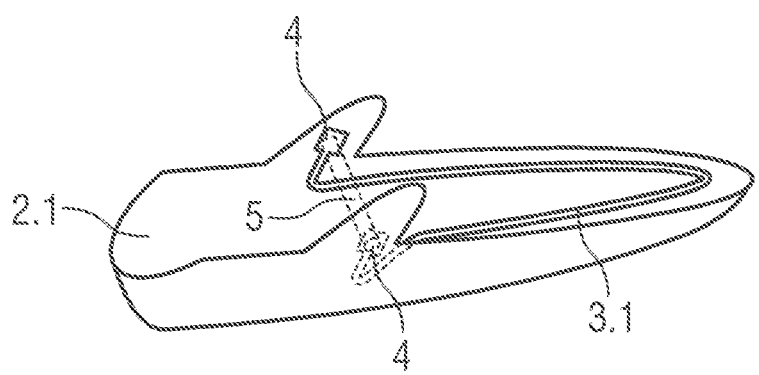
FIG. 3 is a schematic view of a third exemplary embodiment of a part of a housing of a hearing device configured as a molded interconnect device comprising an antenna.

FIG. 3 is a schematic view of a third exemplary embodiment of a part 2.1 of a housing 2 of a hearing device 1. The hearing device 1 may be a behind-the-ear hearing device and the housing part 2.1 may be a top housing part, i.e. a part pointing upward when the hearing device 1 is worn behind the ear of a user. The hearing device 1 may comprise at least one electronic component and at least two parts 2.1 of a housing 2, at least one of them configured as a molded interconnect device comprising at least one electrically conductive trace 3.1 and at least one pin seat 4, e.g. two pin seats 4. The molded interconnect device may be mechanically connected to another one of the parts of the housing 2 or to a frame by at least one assembly pin 5 held in the at least one pin seat 4, wherein the at least one assembly pin 5 also directly or indirectly electrically connects the at least one electrically conductive trace 3.1 to the at least one electronic component which may be fixed on the other one of the parts of the housing or on the frame.

The antenna is configured as a loop antenna having an electrically conductive trace 3.1 with two contact points, each one electrically connected to the electronic component by one assembly pin 5. For this purpose, the electrically conductive trace 3.1 may extend into the pin seats 4. One assembly pin 5 with two metal or metallic coating ends and an electrically insulating section between the two metal or metallic coating ends may be used to contact the antenna to the electronic component, e.g. a printed circuit board or the frame which may be configured as another molded interconnect device. In the alternative, two conductible assembly pins 5 may be used, each one separately contacting one respective electrically conductive trace 3.1, 3.2 to the electronic component, e.g. a printed circuit board or the frame which may be configured as another molded interconnect device. If two assembly pins 5 are used, their respective pin seats 4 may be offset so that the two assembly pins 5 are not coaxially arranged.

Figure 4:
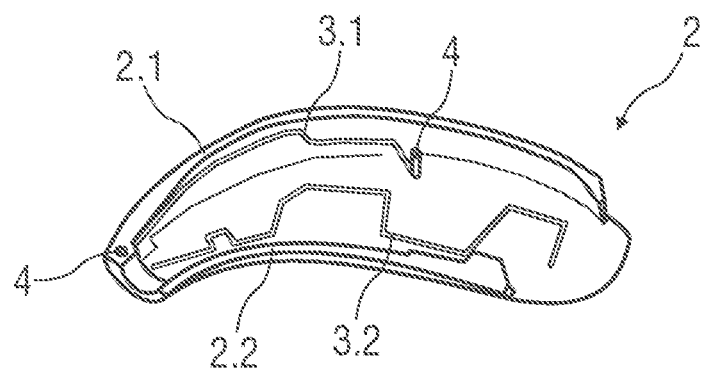
FIG. 4 is a schematic sectional view of an exemplary embodiment of a housing of a hearing device.

FIG. 4 is a schematic view of an exemplary embodiment of a housing 2 of a hearing device 1. The hearing device 1 may be a behind-the-ear hearing device. The hearing device 1 may comprise at least one electronic component and at least two parts 2.1, 2.2 of a housing 2, e.g. a top housing part 2.1 and a bottom housing part 2.2, both of them configured as molded interconnect devices comprising at least one electrically conductive trace 3.1, 3.2 and at least one pin seat 4. The two parts 2.1, 2.2 of the housing 2 may be mechanically connected to each other or to a frame by at least one assembly pin 5 held in the at least one pin seat 4. At least one of the assembly pins 5 also directly or indirectly electrically connects the at least one electrically conductive trace 3.1, 3.2 to the at least one electronic component which may be fixed on the frame.

Figure 5:
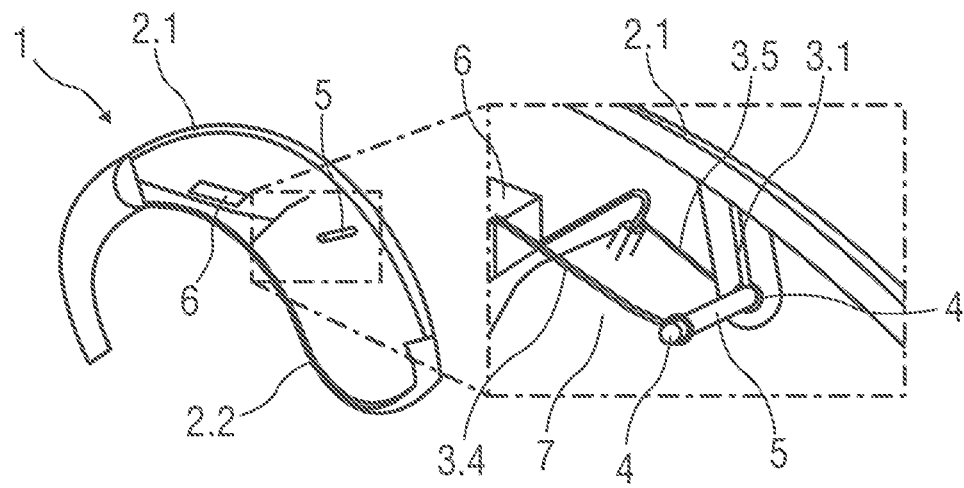
FIG. 5 is a schematic view of a behind-the-ear hearing device with an electronic component connected by an assembly pin to a part of a housing comprising an antenna.
Figure 6:
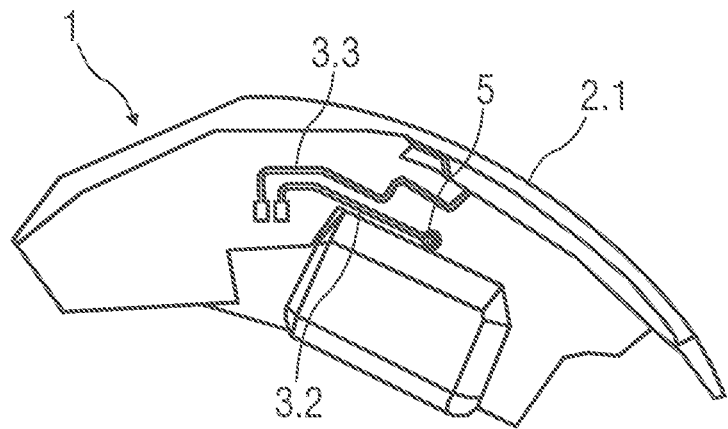
FIG. 6 is a schematic view of the behind-the-ear hearing device of FIG. 5 without the electronic component.

FIG. 5 is a schematic view of a behind-the-ear hearing device 1 with an electronic component 6 connected by an assembly pin 5 to at least one part 2.1, 2.2 of a housing 2 comprising an antenna. FIG. 6 is a schematic view of the behind-the-ear hearing device of FIG. 5, wherein the electronic component 6 is not shown for clarity.

The hearing device 1 may be a behind-the-ear hearing device and comprise at least one electronic component and at least two parts 2.1, 2.2 of a housing 2, e.g. a top housing part 2.1 and a bottom housing part 2.2, at least one of them configured as a molded interconnect device comprising at least one electrically conductive trace 3.1 and at least one pin seat 4. The two parts 2.1, 2.2 of the housing 2 may be mechanically connected to each other and/or to a frame 7 by at least one assembly pin 5 held in the at least one pin seat 4. At least one of the assembly pins 5 also directly or indirectly electrically connects the at least one electrically conductive trace 3.1 to the at least one electronic component 6 which may be fixed on the frame 7. In the illustrated embodiment, the frame 7 is also configured as a molded interconnect device comprising at least one electrically conductive trace 3.4, 3.5 and at least one pin seat 4. The electrically conductive trace 3.4, 3.5 in the frame 7 electrically connects the assembly pin 5 to the electronic component 6. Depending on the design of the antenna, a metal or metallic coating assembly pin 5 or an assembly pin 5 with two metal or metallic coating ends and an electrically insulating section between the two metal or metallic coating ends may be used to contact the antenna to the frame 7 and thus to the electronic component 6. If required, two conductible assembly pins 5 may be used, each one separately contacting one respective electrically conductive trace 3.1 in the housing part 2.1 to the frame 7.

Figure 7:
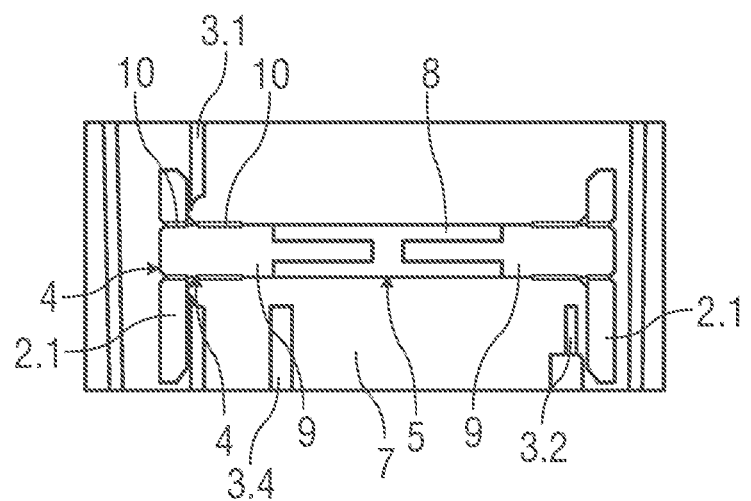
FIG. 7 is a schematic sectional view through the assembly pin having an electrically insulating section between two metal or metallic coating ends.

FIG. 7 is a schematic sectional view through an assembly pin 5 having an electrically insulating section 8 between two metal or metallic coating ends 9. The assembly pin 5 mechanically and electrically connects the housing part 2.1 to the frame 7 which have respective pin seats 4 to receive the assembly pin 5. The electrically conductive traces 3.1, 3.2, 3.4 extend into respective pin seats 4. In each pin seat 4 used as an electrical connection, a bushing 10 may be arranged to improve the electrical contact between the assembly pin 5 and the respective electrically conductive trace 3.1, 3.2, 3.4.

Figure 8:
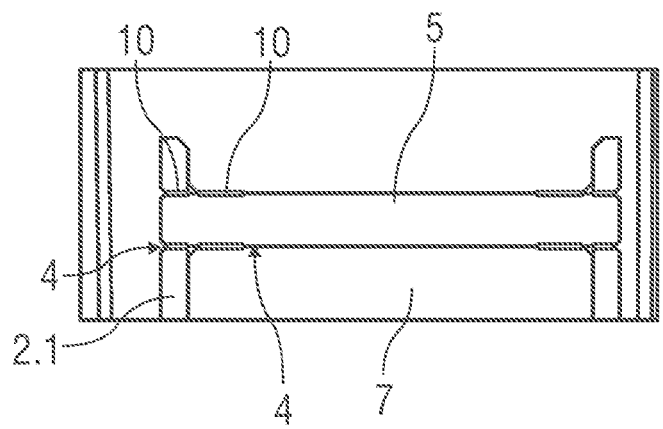
FIG. 8 is a schematic sectional view through the assembly pin configured as a metal pin or metallic coating pin.

FIG. 8 is a schematic sectional view through the assembly pin 5 configured as a conductible pin, e.g. a metal pin or metallic coating pin. The assembly pin 5 mechanically and electrically connects the housing part 2.1 to the frame 7 which have respective pin seats 4 to receive the assembly pin 5. The electrically conductive traces 3.1, 3.2, 3.4 extend into respective pin seats 4. In each pin seat 4 used as an electrical connection, a bushing 10 may be arranged to improve the electrical contact between the assembly pin 5 and the respective electrically conductive trace 3.1, 3.2, 3.4.

The assembly pin 5 which is used for assembling or exchanging the housing parts 2.1, 2.2 at fitters also serves as a detachable conductive connector. The fitter can use a regular mandrel to push the assembly pin 5 out of the housing 2 and frame 7. The conductive assembly pin 5 may connect the antenna in the top housing 2.1 to an integrated circuit in the frame 7 or to a printed circuit board which is electrically connected to the electronic component 6. Therefore different variations in the contact paths are possible:

MID housing part 2.1 to (bushing 10 to) assembly pin 5 to (bushing 10) to MID frame 7 to electronic component 6 which may be directly soldered to the MID frame 7, MID housing part 2.1 to (bushing 10 to) assembly pin 5 to (bushing 10) to MID frame 7 to (bushing 10 to) printed circuit board to electronic component 6, MID housing part 2.1 to (bushing 10 to) assembly pin 5 to (bushing 10) to printed circuit board to (bushing 10 to) electronic component 6.

An antenna may also be integrated in both housing parts 2.1, 2.2 which are connected with each other by one or both assembly pins 5. At least one of the assembly pins 5 is then also used to connect the housing parts 2.1, 2.2 to the frame 7 and/or to the printed circuit board and lead the signal to the electronic component 6.

The material of the assembly pin 5 comprises a conductive material, e.g. a metal. The assembly pin 5 can also be coated with a conductive material, e.g. a metal. Various metals can be used, e.g. titanium, aluminum, etc.

The material, coating and dimension, e.g. diameter or length, of the assembly pin 5 can be used to fine-tune the antenna. For an embodiment of the assembly pin 5 an electrically insulating material, e.g. a plastic material, is used in the electrically insulating section 8 or middle part, and the ends of the assembly pin 5 may be conductible, e.g. metal or metallic coating ends 9. In an exemplary embodiment, the metal or metallic coating ends 9 are made out of metal bolts.

If necessary, the metallic ends of the assembly pin 5 can be positioned with an offset, i.e. recessed into the housing 2, to avoid skin contact or the ends can also be electrically insulated additionally, e.g. comprise a cap made from an electrically insulating material such as plastic (not shown in the pictures).

Figure 9:
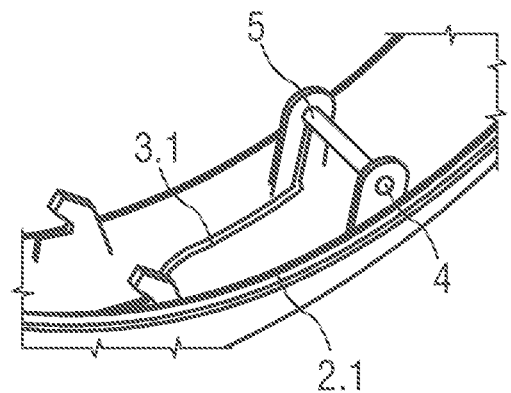
FIG. 9 is a schematic perspective view of the part of the housing illustrating the position of the assembly pin.

FIG. 9 is a schematic perspective view of the part 2.1 of the housing 2 configured as a molded interconnect device, illustrating the position of the assembly pin 5.

Figure 10:
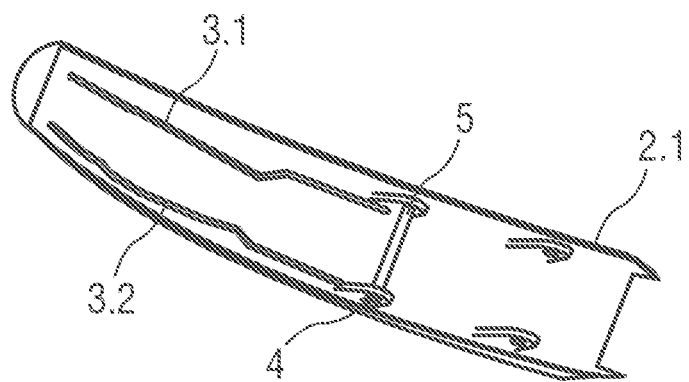
FIG. 10 is another schematic perspective view of the part of the housing illustrating the position of the assembly pin.

FIG. 10 is another schematic view of the part of the housing 2.1 illustrating the position of the assembly pin 5. In FIGS. 9 and 10 the frame 7 is not shown for clarity. As mentioned before the assembly pin 5 can be pressed directly into the MID structured pin seat 4 of the housing part 2.1, 2.2 or frame 7. It is also possible to press a bushing, e.g. a metal bushing and/or a spring bushing, into the MID structured pin seat 4 of the frame 7 or housing part 2.1, 2.2 or into the printed circuit board to create a more reliable contact.

Figure 11:
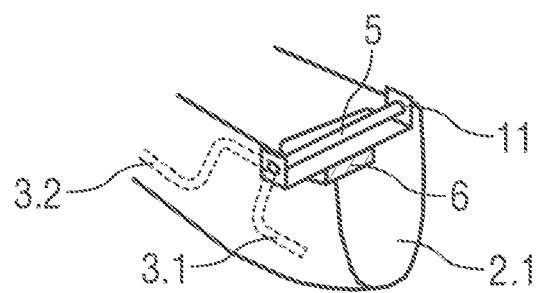
FIG. 11 is a schematic view of an exemplary embodiment of a part of a housing and an assembly pin.

FIG. 11 is a schematic view of an exemplary embodiment of a part 2.1 of a housing 2 and an assembly pin 5. In this embodiment, a printed circuit board 11 is used to connect the assembly pin 5 to the electronic component 6. A metal and/or spring bushing 10 may be used to improve the contact between the assembly pin 5 and the printed circuit board 11. A metal or metallic coating assembly pin 5 or an assembly pin 5 with two metal or metallic coating ends 9 and an electrically insulating section 8 between the two metal or metallic coating ends 9 may be used.

Figure 12:
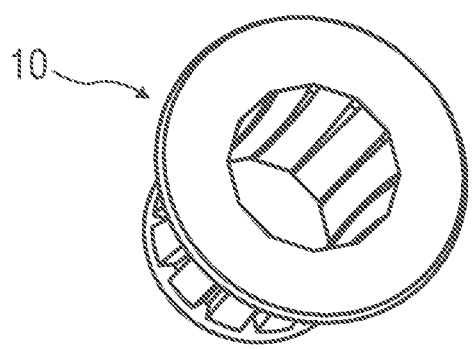
FIG. 12 is a schematic view of an exemplary embodiment of a spring bushing.
Figure 13:
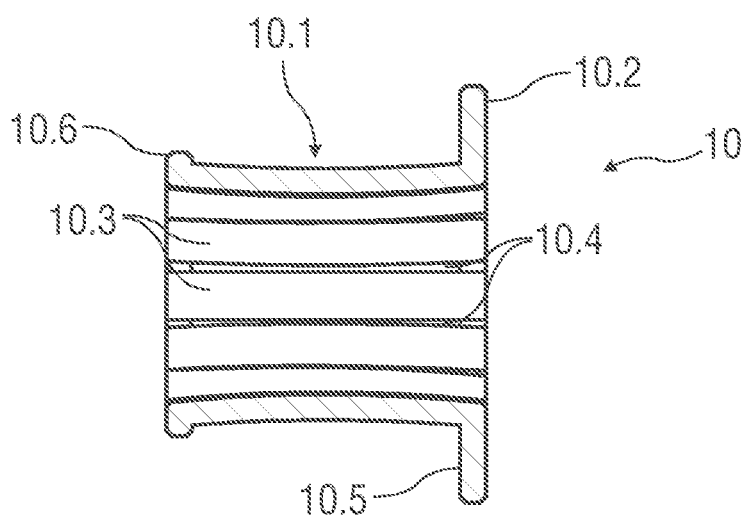
FIG. 13 is another schematic view of the spring bushing.

FIG. 12 is a schematic view of an exemplary embodiment of a spring bushing 10 which may be arranged, e.g. pressed, into the pin seats 4. FIG. 13 is another schematic view of the spring bushing 10. The bushing 10 may comprise a cylindrical or quasi-cylindrical section 10.1 and optionally a collar section 10.2. The cylindrical or quasi-cylindrical section 10.1 may comprise a plurality of tongues 10.3 separated by longitudinal slots 10.4 at least along part of the length of the tongues 10.3, wherein the tongues 10.3 may be biased to contact the assembly pin 5. In an exemplary embodiment, the tongues 10.3 are not separated from each other at a first end 10.5 and at an opposite second end 10.6 of the cylindrical or quasi-cylindrical section 10.1 but are separated by the slots 10.4 between the first end 10.5 and the second end 10.6 and are biased radially inward to contact the assembly pin 5 in a central section between the first end 10.5 and the second end 10.6. The collar section 10.2 may be arranged at the first end 10.5 and extend transversally with regard to a longitudinal direction L. The skilled person readily understands that the bushing 10 can have various shapes.

In addition or as an alternative, the design of the assembly pin 5 may be modified to improve the electrical connection between the MID part 2.1, 2.2, 7 or the printed circuit board 11 or the electronic component 6 and the assembly pin 5.

Figure 14:
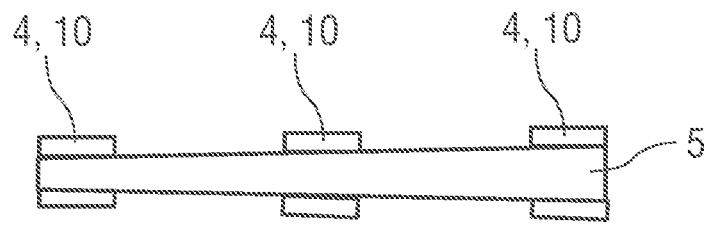
FIG. 14 is a schematic view of an exemplary embodiment of the assembly pin.

FIG. 14 is a schematic view of an exemplary embodiment of the assembly pin 5 having a conical shape and the associated pin seats 4 or bushings 10.

Figure 15:
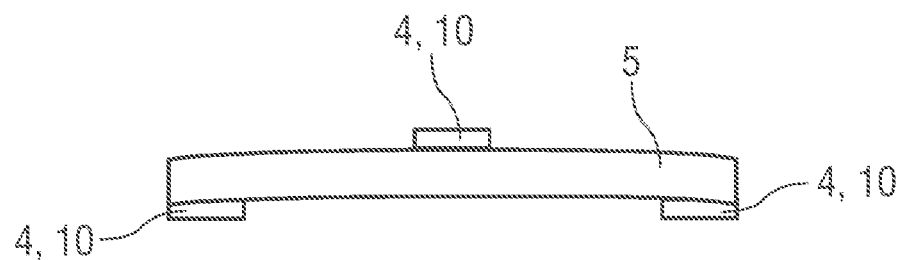
FIG. 15 is a schematic view of another exemplary embodiment of the assembly pin.

FIG. 15 is a schematic view of another exemplary embodiment of the assembly pin 5 configured as a preloaded sprung assembly pin which is not straight but slightly curved and preloaded or sprung so as to be pressed against the associated pin seats 4 or bushings 10.

Figure 16:
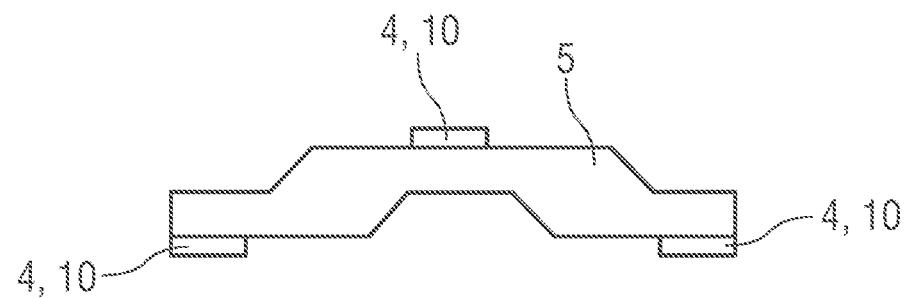
FIG. 16 is a schematic view of yet another exemplary embodiment of the assembly pin.

FIG. 16 is a schematic view of yet another exemplary embodiment of the assembly pin 5 configured as a cranked sprung assembly pin which is not straight but cranked and preloaded or sprung so as to be pressed against the associated pin seats 4 or bushings 10.

In an alternative embodiment, the assembly pin 5 may also be configured to work as a hinge or part thereof to allow for opening and closing a battery compartment. This option may also be employed in an in-the-ear device. For example, the frame 7 may comprise a battery compartment, wherein the assembly pin 5 is configured to serve as a hinge or part thereof.

LIST OF REFERENCES

1 hearing device
2 housing
2.1 part
2.2 part
3.1 to 3.5 electrically conductive trace
4 pin seat
5 assembly pin
6 electronic component
7 frame
8 electrically insulating section
9 metal or metallic coating end
10 bushing
10.1 cylindrical section
10.2 collar section
10.3 tongue
10.4 slot
10.5 first end
10.6 second end
11 printed circuit board

What is claimed is:

1. A hearing device, comprising:
at least one electronic component; and
at least two parts of a housing, at least one of the at least two parts configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component, wherein the at least one electrically conductive trace comprises an antenna or wherein an antenna is formed by the at least one electrically conductive trace, wherein the antenna is a dipole antenna having two arms configured as two electrically conductive traces, both of the arms electrically connected to the electronic component by one assembly pin.

2. A hearing device, comprising:
at least one electronic component; and
at least two parts of a housing, at least one of the at least two parts configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component, wherein the at least one electrically conductive trace comprises an antenna or wherein an antenna is formed by the at least one electrically conductive trace, wherein the antenna is a dipole antenna or a loop antenna having two terminals, wherein each terminal is separately electrically connected to the electronic component by one respective metal or metallic coating assembly pin or by one respective metal or metallic coating end of one assembly pin with two metal or metallic coating ends and an electrically insulating section between the two metal or metallic coating ends.

3. The hearing device according to claim 1, comprising two housing parts, wherein the antenna is formed by at least one electrically conductive trace in each housing part, wherein the housing parts are connected to each other by the at least one assembly pin, at least one of them electrically connecting the conductive traces to the electronic component.

4. The hearing device according to claim 1, wherein the at least one electrically conductive trace is arranged on the molded interconnect device by aerosol jet printing.

5. A hearing device, comprising:
at least one electronic component;
at least two parts of a housing, at least one of the at least two parts configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component; and
a further molded interconnect device comprising at least one electrically conductive trace and at least one pin seat and being mechanically and electrically connected to the molded interconnect device and the at least one electrically conductive trace thereof by at least one further assembly pin held in the at least one pin seat.

6. A hearing device, comprising:
at least one electronic component; and
at least two parts of a housing, at least one of the at least two parts configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component, wherein the at least one assembly pin is a metal pin or a pin with a metallic coating or a pin with two metal or metallic coating ends and an electrically insulating section between the two metal or metallic coating ends.

7. The hearing device according to claim 6, wherein the metal or metallic coating assembly pin and/or a bushing comprises at least one of titanium, aluminum, steel and gold.

8. A hearing device, comprising:
- at least one electronic component; and
- at least two parts of a housing, at least one of the at least two parts configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component, wherein at least one metal or metallic coating spring bushing is arranged in at least one of the pin seats to electrically interconnect the at least one assembly pin to the at least one electrically conductive trace.

9. The hearing device according to claim 1, wherein the at least one assembly pin is configured as a conical assembly pin, a preloaded sprung assembly pin and/or a bent or cranked sprung assembly pin.

10. The hearing device of claim 9, configured as a behind-the-ear part of a hearing device.

11. A hearing device, comprising:
- at least one electronic component; and
- at least two parts of a housing, at least one of the at least two parts configured as a molded interconnect device comprising at least one electrically conductive trace and at least one pin seat, the molded interconnect device mechanically connected to another one of the parts of the housing or to a frame by at least one assembly pin held in the at least one pin seat, wherein the at least one assembly pin also directly or indirectly electrically connects the at least one electrically conductive trace to the at least one electronic component, wherein the frame comprises a battery compartment, wherein the assembly pin is configured as a hinge or part thereof to allow for opening and closing the battery compartment.

* * * * *